(12) United States Patent
Longo et al.

(10) Patent No.: US 8,344,286 B2
(45) Date of Patent: Jan. 1, 2013

(54) ENHANCED QUALITY OF LASER ABLATION BY CONTROLLING LASER REPETITION RATE

(75) Inventors: Peter P. Longo, Hopewell Junction, NY (US); Alfred Wagner, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 1750 days.

(21) Appl. No.: 11/624,235

(22) Filed: Jan. 18, 2007

(65) Prior Publication Data

US 2010/0289186 A1 Nov. 18, 2010

(51) Int. Cl.
*B23K 26/36* (2006.01)
*B29C 35/08* (2006.01)

(52) U.S. Cl. ......... 219/121.69; 219/121.61; 219/121.68; 219/121.73

(58) Field of Classification Search .................. 359/237, 359/238, 245, 246, 257, 278; 219/121.61, 219/121.68, 121.69, 121.62, 121.67, 121.72, 219/121.73; 372/12
See application file for complete search history.

(56) References Cited

U.S. PATENT DOCUMENTS

| | | | | |
|---|---|---|---|---|
| 3,910,679 A | * | 10/1975 | Rushworth et al. | 359/257 |
| 5,162,940 A | * | 11/1992 | Brandelik | 359/333 |
| 5,594,256 A | * | 1/1997 | Siebert | 372/9 |
| 5,730,811 A | * | 3/1998 | Azad et al. | 219/121.61 |
| 6,090,507 A | | 7/2000 | Grenon et al. | |
| 6,156,461 A | | 12/2000 | Grenon et al. | |
| 6,165,649 A | | 12/2000 | Grenon et al. | |
| 6,190,836 B1 | | 2/2001 | Grenon et al. | |
| 6,333,485 B1 | | 12/2001 | Haight et al. | |
| 6,346,686 B1 | * | 2/2002 | Betin et al. | 219/121.61 |
| 2003/0127441 A1 | * | 7/2003 | Haight et al. | 219/121.61 |
| 2004/0101001 A1 | * | 5/2004 | Bergmann et al. | 372/25 |
| 2006/0088984 A1 | * | 4/2006 | Li et al. | 219/121.69 |
| 2006/0169677 A1 | * | 8/2006 | Deshi | 219/121.7 |
| 2006/0266742 A1 | * | 11/2006 | Hall et al. | 219/121.69 |
| 2007/0075063 A1 | * | 4/2007 | Wilbanks et al. | 219/121.85 |
| 2007/0236771 A1 | * | 10/2007 | Zadoyan et al. | 359/257 |
| 2008/0018977 A1 | * | 1/2008 | Bergmann et al. | 359/257 |
| 2008/0216926 A1 | * | 9/2008 | Guo et al. | 219/121.85 |

FOREIGN PATENT DOCUMENTS

CA 2247874 A1 * 3/2000

OTHER PUBLICATIONS

"Laser Induced Periodic Surface Structure: Experiments on Ge, Si, Al, and Brass", Young, Preston, vsn Driel, and Sipe, Physical Review B, vol. 27, No. 2, pp. 1155-1172 (1983).
"Ultraviolet Laser Induced Periodic Surface Structures", Clark and Emmony, Physical Review B, vol. 40, No. 4, pp. 2031-2041 (1989).

(Continued)

*Primary Examiner* — Geoffrey S Evans
(74) *Attorney, Agent, or Firm* — Scully, Scott, Murphy & Presser, P.C.; Daniel P. Morris, Esq.

(57) ABSTRACT

A method of enhancing the quality of laser ablation by controlling the laser repetition rate during the ablation process, wherein the method enhances the quality of laser ablation of a photomask in order to improve the optical quality thereof. Also provided is a system employing the method of enhancing the quality of laser ablation.

10 Claims, 5 Drawing Sheets

OTHER PUBLICATIONS

"Femtosecond Laser Induced Periodic Surface Structure on Diamond Film", Wu, Ma, Fang, Liao, Yu, Chen, Wang, Applied Physics Letters, vol. 82, No. 11, pp. 1703-1705 (2003); and.

"Self Organixed Nanogratings in Glass Irradiated by Ultrashort Light Pulses", Shimotsuma, Kazansky, Qui, Hirao, Physical Review Letters, vol. 19, No. 24, pp. 247205-1 to 247205-4 (2003).

* cited by examiner

FIG. 6  REPETITION RATE REDUCTION:
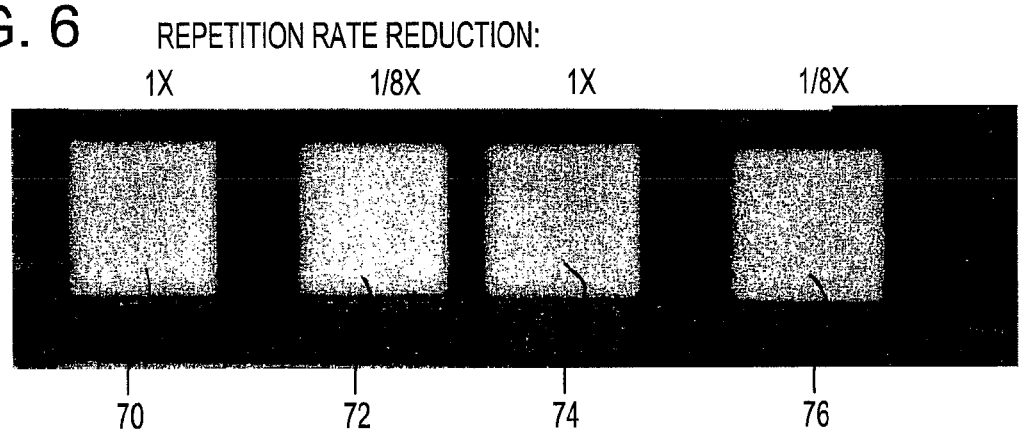
FIG. 7
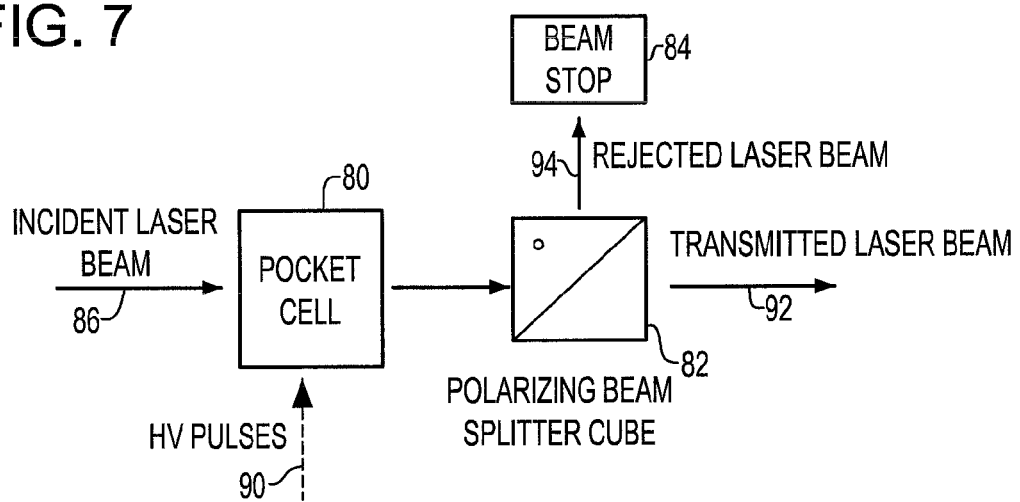

ENHANCED QUALITY OF LASER ABLATION BY CONTROLLING LASER REPETITION RATE

BACKGROUND OF THE INVENTION

1. Field of the Invention

The present invention relates generally to laser ablation, and more particularly pertains to a method and system for enhancing the quality of laser ablation by controlling the laser repetition rate.

When using femtosecond lasers to ablate materials used in photomasks, such as Molybdenum Silicide (MoSi), the material, and therefore the photomask, can be irreversibly damaged by the ablation process. This damage can occur extending across the entire ablated region, resulting in damaged material that cannot be subsequently ablated. Even with implementing a careful control of the ablation process, the edges of the ablation region are usually damaged.

In the process of removing defects from photomasks, the damage caused by the ablation process prevents iteratively trimming the edges of the region which are to be repaired. This limits the spatial resolution of the ablation process, and the ability of tool operators to accurately position a repair. In addition, the ablation process often results in the redepositing of material around the repaired region. This redeposited material can appear in the form of large particles, particularly at the edges of the repaired region. When material is redeposited in this manner, this may result in a "new" mask defect, whereby this new mask defect is difficult to remove.

2. Discussion of the Prior Art

The foregoing issues have been addressed to some extent in the technology, with varying degrees of success, as set forth in the hereinbelow listed prior art publications. However, none of the publications have fully met the requisite intent of the present invention. These publications are as follows: Grenon, et al., U.S. Pat. Nos. 6,190,836; 6,165,649; 6,156,461; 6,090,507; and Haight, et al., U.S. Pat. No. 6,333,485.

This aspect is also discussed in various further publications, such as, for instance, the following articles: "Laser Induced Periodic Surface Structure: Experiments on Ge, Si, Al, and Brass", Young, Preston, vsn Driel, and Sipe, Physical Review B, Vol. 27, No. 2, pgs. 1155-1172 (1983); "Ultraviolet Laser Induced Periodic Surface Structures", Clark and Emmony, Physical Review B, Vol. 40, No. 4, pgs 2031-2041 (1989); "Femtosecond Laser Induced Periodic Surface Structure on Diamond Film", Wu, Ma, Fang, Liao, Yu, Chen, Wang, Applied Physics Letters, Vol. 82, No. 11, pgs 1703-1705 (2003); and "Self Organized Nanogratings in Glass Irradiated by Ultrashort Light Pulses", Shimotsuma, Kazansky, Qui, Hirao, Physical Review Letters, Vol. 19, No. 24, pgs 247205-1 to 4 (2003).

SUMMARY OF THE INVENTION

Accordingly, in order to obviate or ameliorate the foregoing drawbacks, pursuant to the invention, it has been ascertained that by adjusting the repetition rate of the optical pulses, there can be largely eliminated damage to the photomask material, as described above. For example, by reducing the repetition rate at the repair region, there is essentially eliminated the thermal effects which damage the material, and related factors which cause material redeposition.

Accordingly, it is an object of the present invention to provide a method of enhancing the quality of laser ablation by controlling the laser repetition rate during the ablation process.

Another object of the invention is to provide a method of enhancing the quality of laser ablation of a photomask in order to improve the optical quality thereof.

Yet another object of the invention resides in the provision of a system employing the method of enhancing the quality of laser ablation, as described herein.

The foregoing and other objects, aspects, features, and advantages of the invention will become more apparent from the following description and from the claims.

BRIEF DESCRIPTION OF THE DRAWINGS

In the drawings, like reference characters generally refer to the same parts throughout the different views. Moreover, the drawings are not necessarily to scale, emphasis instead being generally placed upon illustrating the principles of the invention, wherein:

FIG. 6 shows illustrative images of ablated Chromium squares at two laser repetition rates, according to a further embodiment of the invention;

FIG. 7 is an illustrative block diagram of a system for selecting laser pulse repetition rate, according to an embodiment of the invention.

DETAILED DESCRIPTION OF THE INVENTION

The present invention relates generally to laser ablation, and more particularly to enhancing the quality of laser ablation by controlling laser repetition rate.

During the fabrication of optical photomasks, defects inevitably occur, whereby these defects are typically extra material that needs to be removed. Femtosecond laser ablation is one method that is used to remove this excess material.

An advantage of using femtosecond laser ablation to remove these defects is the non-thermal nature of the ablation process. However, although the ablated material is removed non-thermally, the regions adjacent to the ablated region can be significantly heated. For example, if a Gaussian shaped femtosecond laser beam of sufficient intensity is scanned across a material's surface, the central portion of the laser beam will non-thermally ablate the material. However, the outer portion of the laser beam, which is below the threshold energy for material ablation, will deposit thermal energy into the material. Consequently, the edges of an ablation region will experience a rise in temperature, due to which, unfortunately, this heating effect can thermally transform the material. For example, when using femtosecond lasers in order to ablate materials used in photomasks (e.g., MoSi), the material, and therefore the photomask, can be irreversibly damaged by the ablation process. The extent of this damage can occur across the entire ablated region, resulting in damaged material that cannot be subsequently ablated, as shown in FIG. 1, described herein below.

Figure 1:
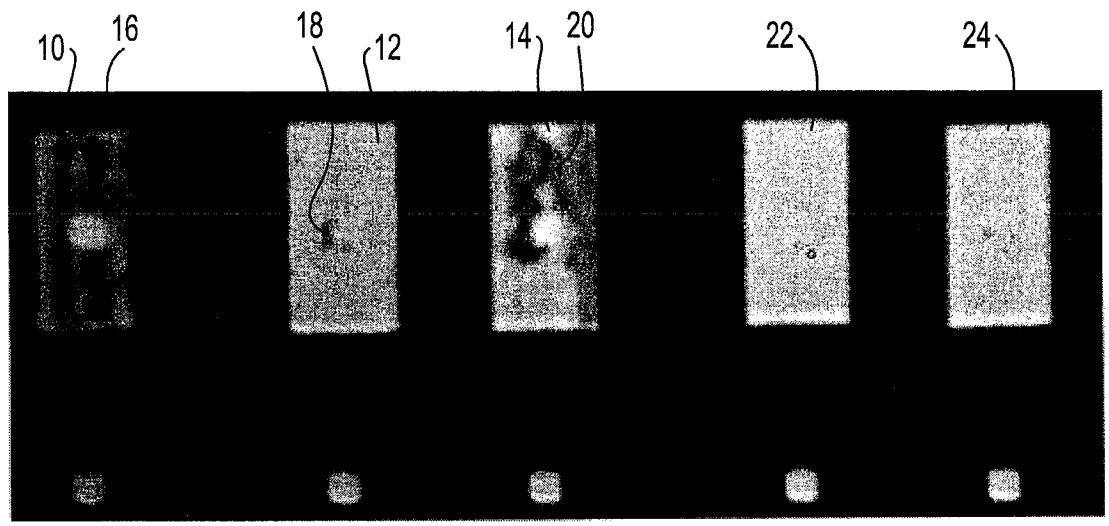
FIG. 1 shows illustrative images of ablated MoSi via a conventional approach, and images of ablated MoSi via the method according to one embodiment of the invention.

Referring to FIG. 1, there are shown three examples of MoSi material ablated via a conventional method and two examples of MoSi material ablated using a method according to one embodiment of the invention.

The first three ablations 10, 12 and 14 were achieved using a laser with a one KHz repetition rate at energies of ten, twenty, and fifteen microjoules, respectively. The beam diameter of the laser was approximately 150 nm, and the beam-scanning rate was approximately 10 µm per second. The dark areas 16, 18 and 20 within the ablated rectangles 10, 12 and 14 represent material that has been thermally transformed and can no longer be ablated, thereby resulting in a small process window and in a reduced repair success rate. In order to prevent the material from being thermally transformed during the ablation process, the repetition rate of the laser is decreased, according to one embodiment of the invention.

Still referring to FIG. 1, the last two ablations 22 and 24 were achieved using the laser at ¼ of the one KHz repetition rate and at energies of fifteen and twenty microjoules, respectively. In both cases, the MoSi was completely removed, with no thermally transformed material remaining. The lower laser repetition rate allows the edges of the ablated MoSi to cool off.

Figure 2:
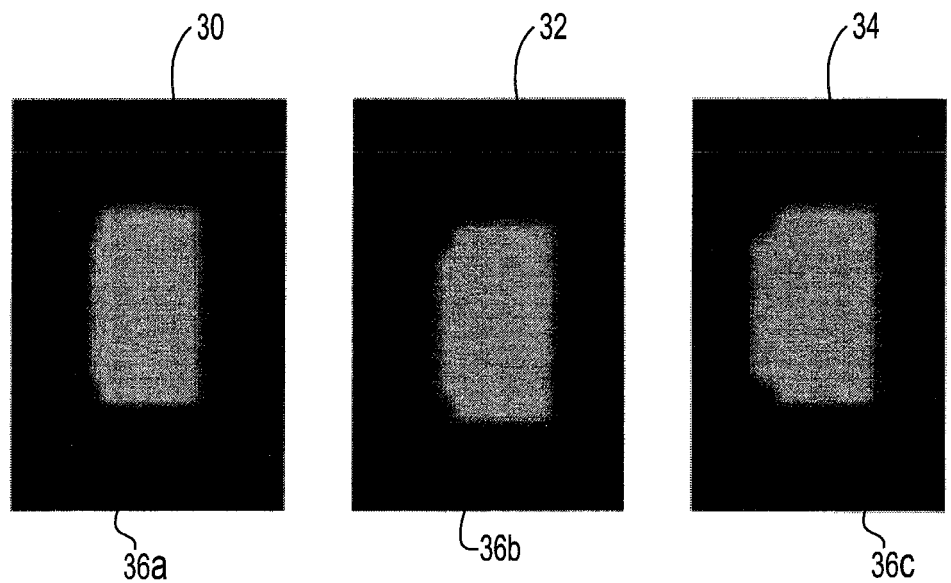
FIG. 2 illustrates images of an MoSi edge, which is iteratively trimmed using laser ablation.

Referring to FIG. 2, images 30, 32 and 34 of a MoSi edge 36a, 36b and 36c have been iteratively trimmed (jogged left by approximately 20 nm increments) by using laser ablation, as shown. During the ablation process, the edges of MoSi are particularly susceptible to thermal transformation. When removing defects from photomasks, edge damage prevents iteratively trimming the edges of the region to be repaired. This limits the spatial resolution of the ablation process and the ability of a tool operator to accurately position a repair.

Figure 3A:
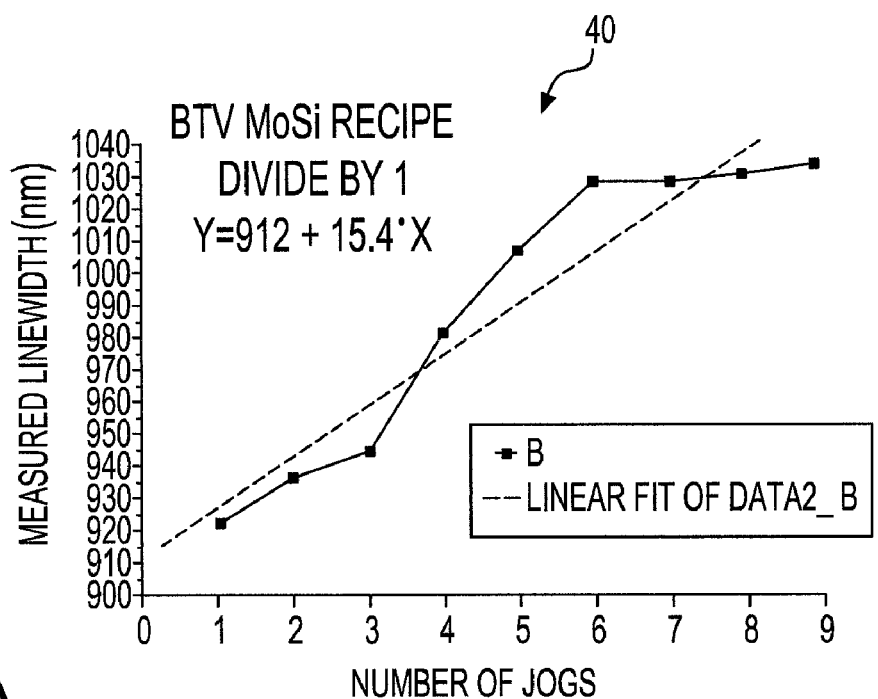
FIGS. 3A and 3B show, respectively, illustrative graphs of the effect of the laser repetition rate on the trimming of a MoSi edge.
Figure 3B:
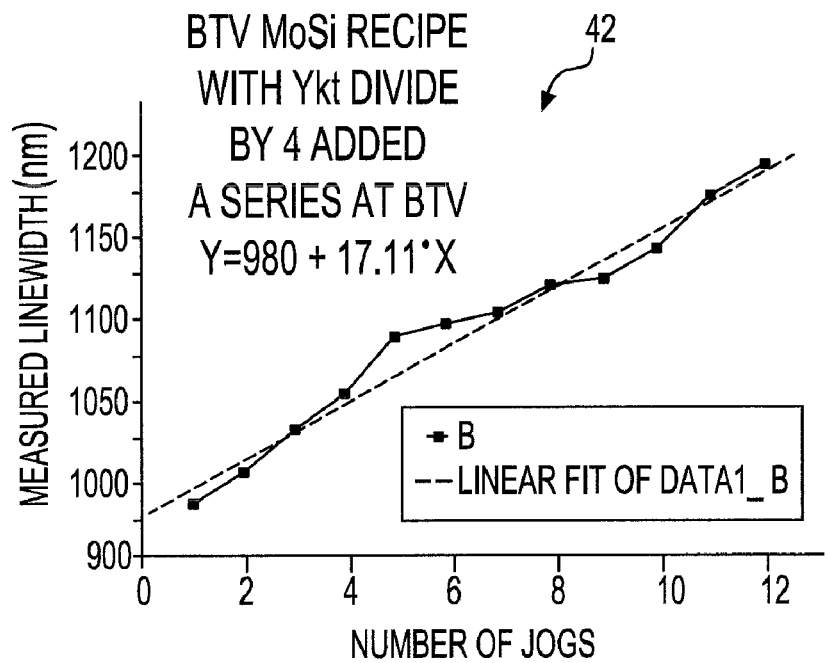

Referring to FIGS. 3A and 3B, in one embodiment, graphs 40, 42 illustrate the effect of laser repetition rate on trimming a MoSi edge is shown. The graphs 40, 42 show a plot of the change in measured line width, as edge material is iteratively removed. As shown in graph 42, reducing the laser repetition rate (reduced to ¼ of the repetition rate for graph 40) improves control of the MoSi edge nibbling by removing thermal transformation and material redeposition at the edges of the repair.

Reduction in these thermal effects can also be achieved by increasing the spatial scan rate of the laser beam. This spreads the thermal energy over a larger area per unit time, and thus allows more time for the heat to dissipate. For example, doubling the scan rate is approximately equivalent to halving the laser repetition rate when ablating large areas. However, when small areas are ablated, reducing the laser repetition rate is more effective in reducing thermal effects.

Figure 4:
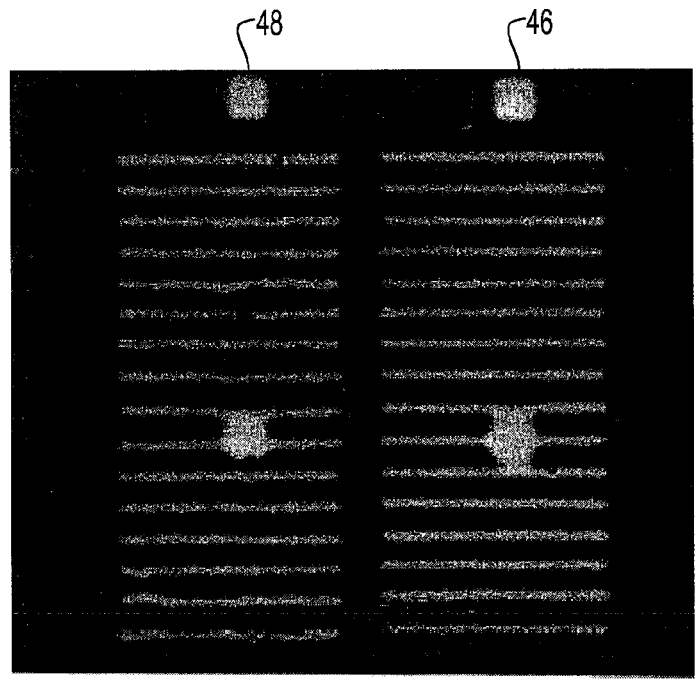
FIG. 4 is an illustrative image of improved line straightness and uniformity ablated in MoSi using a reduced laser repetition rate, according to an embodiment of the invention.

Referring to FIG. 4, in one embodiment, there is shown an image of improved line straightness and uniformity ablated in MoSi using a reduced laser repetition rate. Reducing the laser repetition rate also improves the spatial fidelity of the ablation process. As shown in FIG. 4, the uniformity and straightness of lines 46 ablated in MoSi is significantly improved with a 4× reduction in laser repetition rate as compared to lines 48 ablated in MoSi with a 1× laser repetition rate. Reducing the laser repetition rate allows more time for the ablation products to flow away from the ablation region. This has the desirable effect of clearing the optical path of the ablation products, thus allowing the next laser pulse to travel to the sample undisturbed (i.e., without being attenuated or deflected by debris).

In addition, the ablation process often results in redepositing material around the repaired region. This redeposited material can appear as large particles, particularly at the edges of the repaired region. When this occurs, it results in a "new" mask defect that is difficult to remove. By allowing more time for the ablation products to flow away from the ablation region, the reduced laser repetition rate reduces the amount of redeposited material.

Figure 5:
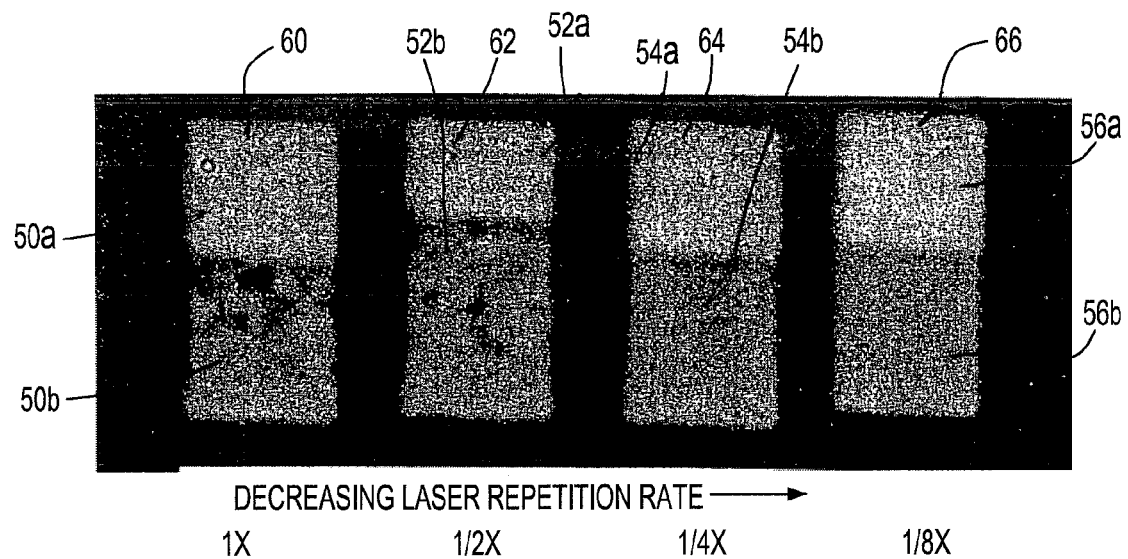
FIG. 5 shows illustrative images of an improvement in edge definition (roughness), and a reduction in formation and redeposition of large debris particles for chromium ablation with decreasing laser pulse rate, according to an embodiment of the invention.

Referring to FIG. 5, in another embodiment, there are shown images of improvement in edge definition (roughness) and reduction in formation and redeposition of large debris particles for chromium (Cr) ablation with decreasing laser pulse rate. The lower half 50b, 52b, 54b, 56b of the four ablated rectangles 60, 62, 64, 66 have received one pass of the laser beam, intentionally leaving behind some material. The upper half 50a, 52a, 54a, 56a of the rectangles 60, 62, 64, 66 have received two laser passes thus removing the remaining Cr. There are large "clumps" of redeposited material in the rectangle 60 (laser repetition rate of 1×), while the rectangle 66 (laser repetition rate of ⅛×) evidences no clumps. The edge definition and amount of large residual debris particles improves with decreasing laser repetition rate.

Referring to FIG. 6, in an embodiment, there is shown images of ablated Chromium squares 70, 72, 74, 76 at two laser repetition rates. The two squares 72, 76 that were ablated at ⅛ of the normal repetition rate show less edge roughness (i.e., improved edge definition) due to a reduction in the formation and subsequent redeposition of large debris particles, as compared to squares 70, 74.

Figure 8:
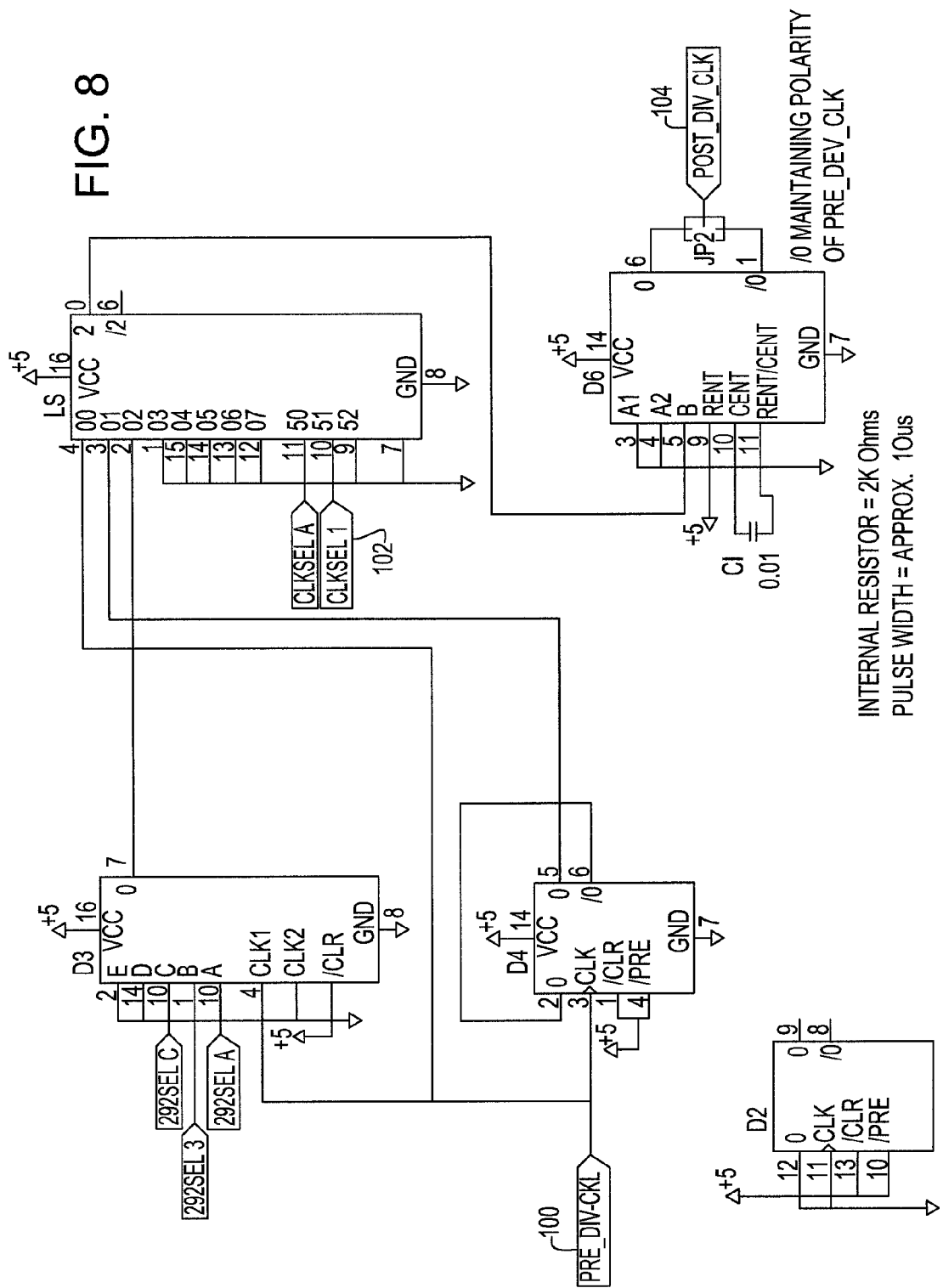
FIG. 8 is an illustrative schematic diagram showing control electronics of the system for selecting laser pulse repetition rate, as represented in FIG. 7.

Referring to FIGS. 7 and 8, pursuant to an embodiment, there are shown a block diagram of a system for selecting laser pulse repetition rate, and a schematic diagram of associated control electronics. Because the femtolaser is most stable operating at a large, fixed repetition rate, a reduced repetition rate is achieved by selecting a subset of the available laser pulses. The subset of laser pulses is delivered to the photomask/sample without altering the fixed laser repetition rate. The system allows a user to set the laser repetition rate such that one pulse out of every N pulses is incident upon the photomask, whereby N is a computer selectable integer. The instant system and method allows selection of an optimum optical repetition rate for each material to be ablated and the particular system geometry near the ablation region.

The system includes a Pockell Cell 80, a polarizing beam splitter cube 82, and a beam stop 84. A one KHz incident laser beam 86 (from a femtolaser, not shown) enters the Pockell Cell 80. A waveform of electronic pulses is sent to a high voltage amplifier (not shown) to create a high voltage waveform 90. The high voltage waveform 90 is applied to the Pockell Cell 80. When zero volts are applied, the polarization of the incident laser beam 86 is zero polarized; whereas, when a high voltage pulse of approximately 5000 volts is applied to the Pockell Cell 80, the polarization of the incident laser beam 86 is polarized ninety degrees.

The laser light exiting the Pockell Cell 80 is transmitted to the polarizing beam splitter cube 82. If the incident laser light is zero polarized, all the laser light is directed to the beam stop 84 along rejected laser beam 94. If the incident laser light is polarized ninety degrees, all the laser light is transmitted through the beam splitter cube 82.

The frequency of the high voltage waveform or pulses 90 is varied to control the number of available one KHz incident laser pulses, which are used for ablation. For example, if the high voltage waveform 90 is applied at ¼ the one KHz incident laser beam 86, the transmitted laser beam 92 (used for ablation) is only 250 Hz. In other words, only ¼ of the one KHz pulse are used for ablation. Typically, the high voltage waveform pulses 90 (created by electronic pulses sent to the high voltage amplifier) are generated at a fixed repetition rate, which is some fraction of the repetition rate of the laser.

In another embodiment, the electronic pulses are transmitted to the circuitry, as shown in FIG. 8, and then transmitted to the high voltage amplifier. The circuitry shown in FIG. 8 is used to select one out of every N pulses of the one KHz laser beam 86. N is selected based on the material to be ablated. In operation, an input 100 receives a sync pulse from the one KHz laser, an input 102 is the computer selected N, and an output 104 is the electronic trigger pulse that triggers the high voltage amplifier, which then controls the Pockell Cell 80.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but to fall within the spirit and scope of the appended claims.

What is claimed is:

1. A method of improving femto second laser ablation by controlling the thermal heating of a photomask material, the method comprising:
    reducing the incident femtosecond laser beam repetition rate during laser ablation;
    inserting a Pockell Cell in an optical path of the incident laser beam;
    applying a high voltage waveform to the Pockell Cell;
    reducing the number of available incident laser beam pulses used for ablation by applying the high voltage waveform to the Pockell Cell; and
    reducing the laser beam repetition rate using the preceding steps, and setting the laser beam at one quarter of a KHz repetition rate and at an energy in the range of fifteen to twenty microjoules.

2. The method as claimed in claim 1, further comprising:
    reducing the number of available incident laser pulses used for ablation to one out of every N incident laser pulses.

3. The method as claimed in claim 2, wherein N is electronically selectable.

4. The method as claimed in claim 1, wherein a redeposition of ablated material is reduced by reducing the concentration of ablation products through reducing the incident laser beam repetition rate in a vicinity of an ablation region.

5. The method as claimed in claim 1 wherein the thermal heating is controlled by increasing the spatial scan rate of the incident laser beam.

6. The method as claimed in claim 1, wherein the femtosecond laser ablation is improved by controlling the rate of formation and dispersement of ablation products by reducing the incident laser beam repetition rate.

7. The method, as claimed in claim 1, wherein a spatial resolution of the femtosecond laser ablation is improved by controlling the concentration of ablation products in an optical path of the incident laser beam by reducing the incident laser beam repetition rate.

8. The method as claimed in claim 1, wherein a concentration of ablation products is reduced by decreasing the incident laser beam repetition rate such that the time between incident laser beam pulses is greater than a residence time of the ablation products in an optical path of the incident laser beam.

9. A system for improving femtosecond laser ablation by controlling thermal heating of a photomask material, the system comprising:
    means for reducing the incident femtosecond laser beam repetition rate during laser ablation;
    the means for reducing the repetition rate comprises:
        a Pockell Cell positioned in an optical path of an incident laser beam, the Pockell cell being configured to be controlled by a high voltage waveform for reducing the number of available incident laser beam pulses used for ablation; and
        a polarizing beam splitter cube configured to receive the laser beam exiting the Pockell Cell;
    wherein the laser beam is set at one quarter of a KHz repetition rate and at an energy in the range of fifteen to twenty microjoules.

10. The system as claimed in claim 9, wherein the number of available incident laser pulses used for ablation is reduced to one out of every N incident laser pulses.

* * * * *